United States Patent
Kang (10) Patent No.: US 7,590,024 B2
(45) Date of Patent: Sep. 15, 2009

(54) NONVOLATILE SEMICONDUCTOR MEMORY DEVICE

(75) Inventor: Hee Bok Kang, Cheongju-si (KR)

(73) Assignee: Hynix Semiconductor Inc., Icheon-si (KR)

( * ) Notice: Subject to any disclaimer, the term of this patent is extended or adjusted under 35 U.S.C. 154(b) by 140 days.

(21) Appl. No.: 11/646,353

(22) Filed: Dec. 28, 2006

(65) Prior Publication Data

US 2007/0153620 A1    Jul. 5, 2007

(30) Foreign Application Priority Data

Dec. 30, 2005   (KR)   .................. 10-2005-0135236
Dec. 30, 2005   (KR)   .................. 10-2005-0135237

(51) Int. Cl.
G11C 8/00          (2006.01)
(52) U.S. Cl. .................. 365/230.06; 365/230.02; 365/189.14; 365/189.16; 365/185.26; 365/188
(58) Field of Classification Search ............ 365/230.06, 365/230.02, 189.14, 189.16, 189.04, 185.26, 365/188
See application file for complete search history.

(56) References Cited

U.S. PATENT DOCUMENTS

| 4,667,308 | A | * | 5/1987 | Hayes et al. ............ 365/230.02 |
| 6,034,882 | A | * | 3/2000 | Johnson et al. ............. 365/103 |
| 6,643,159 | B2 | | 11/2003 | Fricke et al. |
| 6,822,903 | B2 | | 11/2004 | Scheuerlein et al. |
| 7,184,293 | B2 | | 2/2007 | Hasegawa et al. |
| 2003/0026121 | A1 | | 2/2003 | Johnson et al. |
| 2004/0170045 | A1 | | 9/2004 | Nishihara |
| 2004/0188714 | A1 | * | 9/2004 | Scheuerlein et al. ........ 257/200 |
| 2005/0105371 | A1 | | 5/2005 | Johnson et al. |
| 2006/0108627 | A1 | | 5/2006 | Choi et al. |

FOREIGN PATENT DOCUMENTS

| KR | 1019990084635 | 12/1999 |
| KR | 1020000014361 | 3/2000 |
| KR | 1020000025935 | 5/2000 |
| KR | 1020000059830 | 10/2000 |
| KR | 1020030070886 | 9/2003 |
| KR | 1020040079884 | 9/2004 |

OTHER PUBLICATIONS

Notice of Allowance issued from the Korean Intellectual Property Office on Oct. 21, 2008, in counterpart Korean Application No. 2005-0135237.

* cited by examiner

*Primary Examiner*—Thong Q Le
(74) *Attorney, Agent, or Firm*—Finnegan, Henderson, Farabow, Garrett & Dunner, L.L.P.

(57) ABSTRACT

A nonvolatile semiconductor memory device includes three-dimensional cell arrays to reduce the chip size. The cell arrays each having unit cells arranged in row and column directions includes multi-layered unit block cell arrays. Based on the deposition direction of the cell arrays, a unit bank cell array includes the unit block cell arrays arranged in directions X, Y, and Z in a given group. A plurality of unit bank cell arrays are configured to perform read/write operations individually.

48 Claims, 12 Drawing Sheets

NONVOLATILE SEMICONDUCTOR MEMORY DEVICE

RELATED APPLICATIONS

This application is based upon and claims the benefit of priority to Korean patent application numbers 10-2005-135236 and 10-2005-135237, filed on Dec. 30, 2005, the entire contents of which are incorporated herein by reference.

BACKGROUND

The present invention generally relates to a nonvolatile semiconductor memory device, and more specifically, to a semiconductor memory device comprising a three-dimensional cell array to reduce chip size.

A nonvolatile ferroelectric memory, for example, a Ferroelectric Random Access Memory (FeRAM) device has attracted considerable attention as a candidate for the next generation memory device, because it has a data processing speed as fast as a Dynamic Random Access Memory (DRAM), and it conserves data even after the power is turned off.

An FeRAM having a structure similar to that of a DRAM includes capacitors made of a ferroelectric material, which has a high residual polarization, allowing retention of data after power is turned off.

A unit cell of a conventional nonvolatile FeRAM device includes a switching element and a nonvolatile ferroelectric capacitor. The switching element performs a switching operation depending on a state of a word line to connect the nonvolatile ferroelectric capacitor to a sub bit line. The nonvolatile ferroelectric capacitor is connected between a plate line and one terminal of the switching element. Here, the switching element of the conventional FeRAM is a NMOS transistor, whose switching operation is controlled by a gate control signal.

In the conventional FeRAM, as the cell size becomes smaller, data retention characteristics are degraded. Thus, it is difficult to perform a normal operation of cells. For example, when a voltage is applied to an adjacent cell in a read mode of the cell, data is destroyed due to an interface noise generated between the cells. Also, when a write voltage is applied to an unselected cell in a write mode of the cell, data of the unselected cells is destroyed, thus not facilitating a random access operation.

For Metal Ferroelectric Insulator Silicon (MFIS) and Metal Ferroelectric Metal Insulator Silicon (MFMIS), the data retention characteristics is degraded by depolarization charges. The degradation of data retention characteristics caused by smaller cell size is also a problem for other well-known nonvolatile memory devices such as a phase-change RAM (PRAM) device, a magnetoresistive RAM (MRAM) device, or a resistive RAM (ReRAM) device.

SUMMARY

Various embodiments consistent with the present invention are directed to providing a nonvolatile semiconductor memory device including a plurality of vertically multi-layered unit block cell arrays, which are arranged in row and column directions to reduce a chip size, and which are divided into banks for the read/write operations to be performed by the banks.

According to an embodiment consistent with the present invention, a nonvolatile semiconductor memory device comprises a unit block cell array including a plurality of multi-layered cell arrays each having a plurality of unit cells arranged in row and column directions. A plurality of unit bank cell arrays, each comprising a plurality of unit block cell arrays in a given group, is arranged in directions X, Y, and Z based on a deposition direction of the plurality of cell arrays, so as perform read/write operations individually.

According to an embodiment consistent with the present invention, a nonvolatile semiconductor memory device comprises a first cell array including a plurality of unit cells, each being arranged in row and column directions, at least a second cell array, each including a plurality of unit cells, which are arranged in row and column directions, and in a vertical direction relative to the first cell array, a unit block cell array including the first cell array and the second cell array, and a unit bank cell array including at least one of the unit block cell arrays. The unit block cell array includes one selected from the first cell array and the second cell array according to a vertical address.

According to an embodiment consistent with the present invention, a nonvolatile semiconductor memory device comprises a unit block cell array including a plurality of vertically multi-layered cell arrays each having a plurality of unit cells arranged in row and column directions, a row address decoder configured to decode a row address to activate a word line of a selected one of the cell arrays, a vertical address decoding unit configured to decode a vertical address to the selected one of the cell arrays and to connect an output signal of the row address decoder to a word line of the selected cell array, and a column address decoder configured to decode a column address to activate a bit line of the selected cell array.

According to an embodiment consistent with the present invention, a nonvolatile semiconductor memory device comprises a unit block cell array including a plurality of vertically multi-layered cell arrays, each having a plurality of unit cells arranged in row and column directions, a column address decoder configured to decode a column address to activate a bit line of a selected one of the cell arrays, a vertical address decoding unit configured to decode a vertical address to the selected one of the cell arrays and to connect an output signal of the column address decoder to a bit line of the selected cell array, and a row address decoder configured to decode a row address to activate a word line of the selected cell array.

DETAILED DESCRIPTION

The present invention will be described in detail with reference to the accompanying drawings.

Figure 1:
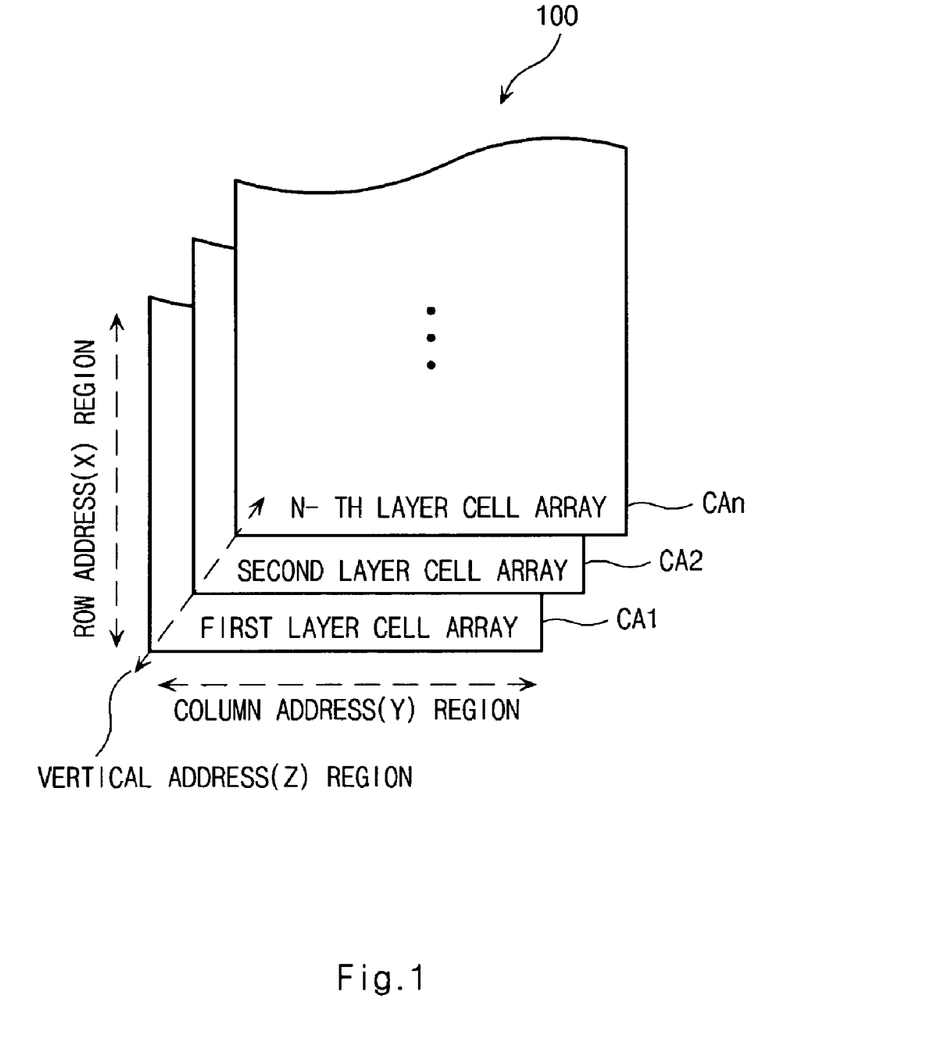
FIG. 1 is a diagram illustrating a unit block cell array of a nonvolatile semiconductor memory device according to an embodiment consistent with the present invention.

FIG. 1 is a diagram illustrating a unit block cell array 100 of a nonvolatile semiconductor memory device according to an embodiment consistent with the present invention.

Unit block cell array 100 may include a plurality of cell arrays CA1~CAn, each of which has a two-dimensional plane structure including a row address (X) region arranged in a row direction (axis X) and a column address (Y) region arranged in a column direction (axis Y).

Unit block cell array 100 has a three-dimensional structure, where cell arrays CA1~CAn may be deposited in a vertical direction (axis Z). Unit block cell array 100 may select one of cell arrays CA1~CAn by a vertical address Z.

In cell arrays CA1~CAn, a row address X selects a word line, and a column address Y selects a bit line. Vertical address Z selects one of cell arrays CA1~CAn.

Figure 2:
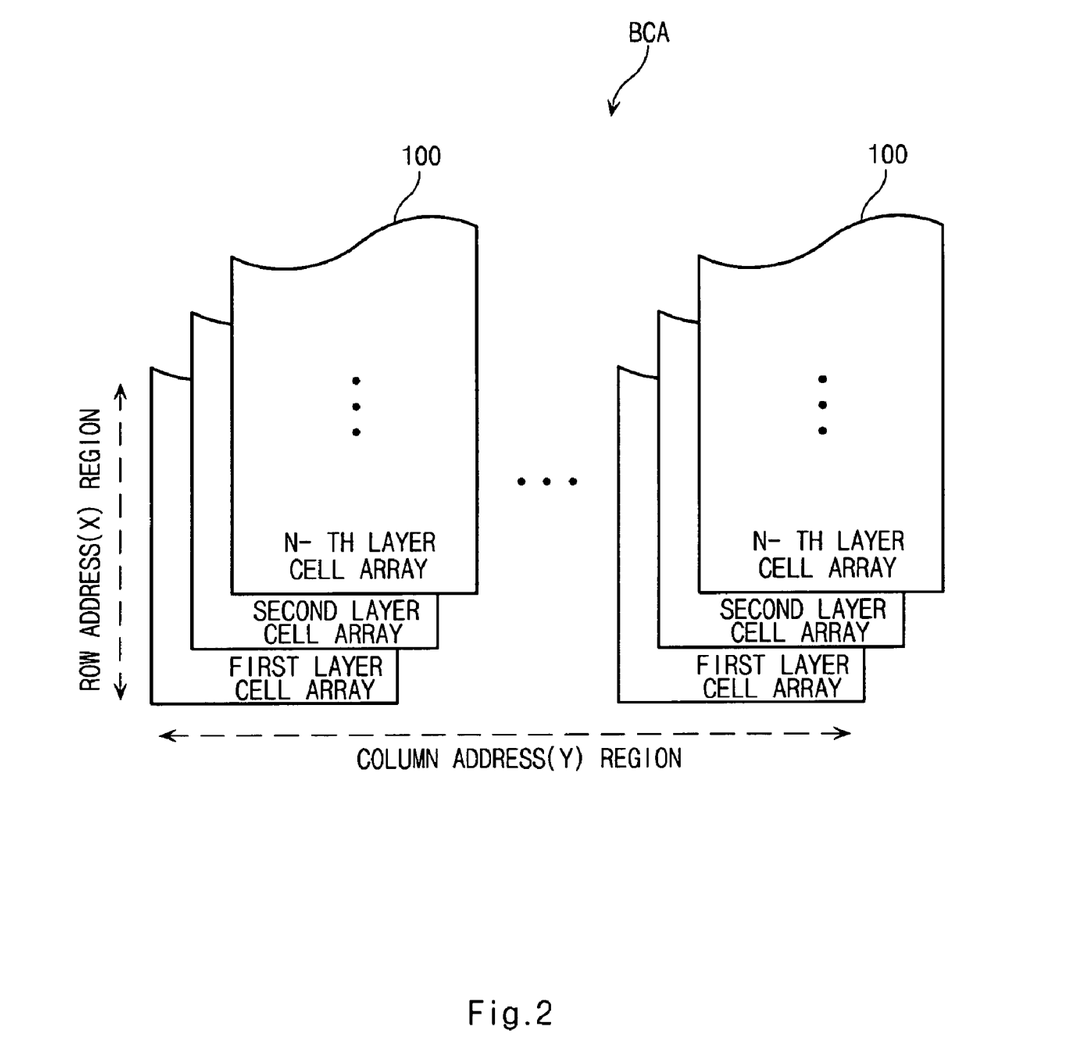
FIG. 2 is a diagram illustrating a unit bank cell array of a nonvolatile semiconductor memory device according to an embodiment consistent with the present invention.

FIG. 2 is a diagram illustrating a unit bank cell array BCA of a nonvolatile semiconductor memory device according to an embodiment consistent with the present invention.

As described above, unit block cell array 100 may include a plurality of cell arrays CA1~CAn, which are deposited in a vertical direction. Unit bank cell array BCA may include a plurality of unit block cell arrays 100.

In one embodiment, cell arrays CA1~CAn are explained with one unit block cell array 100, and unit block cell arrays 100 are explained with one unit bank cell array BCA. However, in another embodiment, one unit bank cell array BCA may include a plurality of cell arrays CA1~CAn formed in the same layer, and a plurality of unit bank cell arrays BCA may be deposited vertically.

Figure 3:
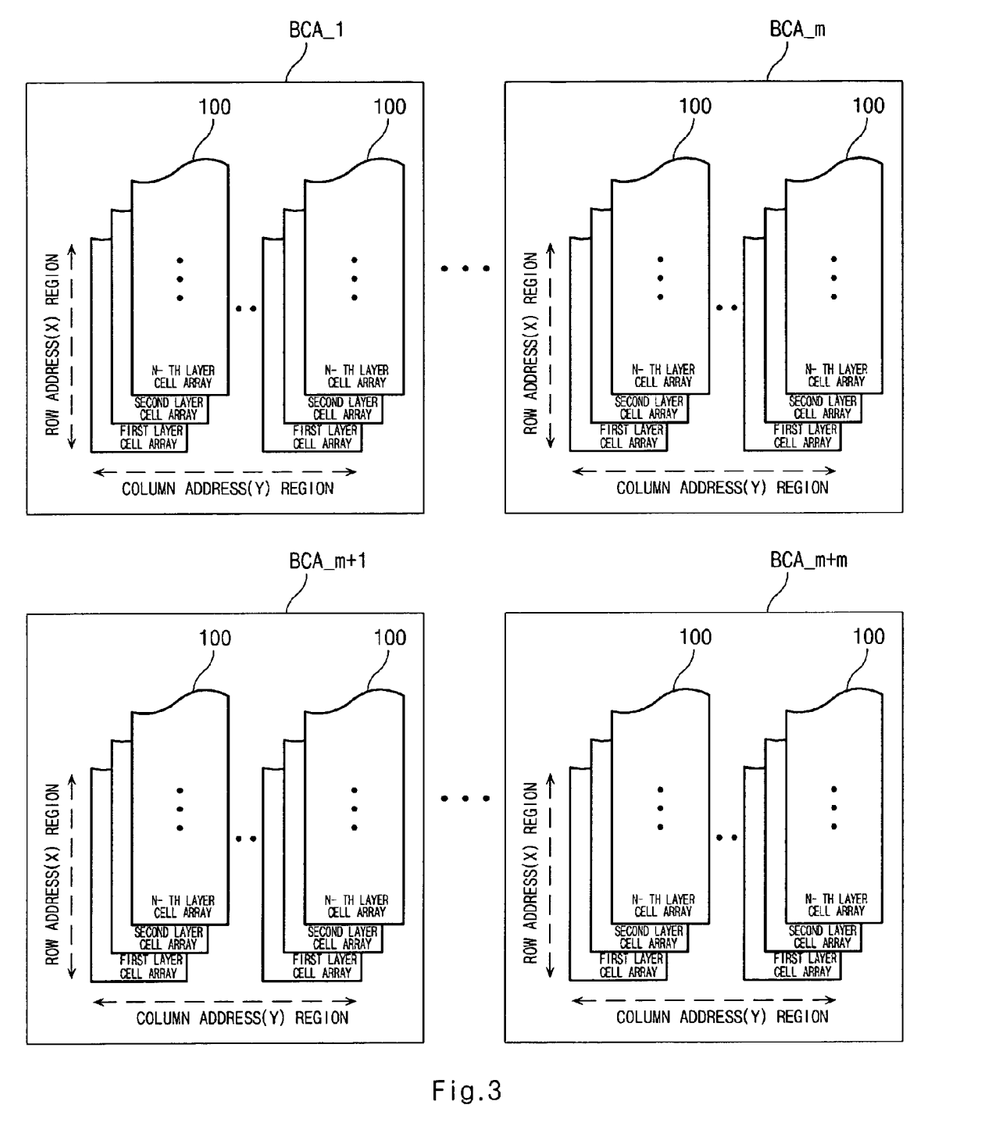
FIG. 3 is a diagram illustrating a plurality of bank cell arrays of a nonvolatile semiconductor memory device according to an embodiment consistent with the present invention.

As shown in FIG. 3, a plurality of unit bank cell arrays BCA_1~BCA_m+m, which are arranged in row and column directions, are configured to perform read/write operations so as to improve the operation speed.

Although a plurality of unit bank cell arrays BCA are arranged in row and column directions in this particular embodiment, a plurality of unit bank cell arrays BCA may be arranged in directions X, Y, and Z based on the deposition direction of cell arrays CA1~CAn. One unit bank cell array BCA, which includes unit block cell arrays 100 in a given group, is configured to perform read/write operations by unit bank cell array BCA.

Figure 4:
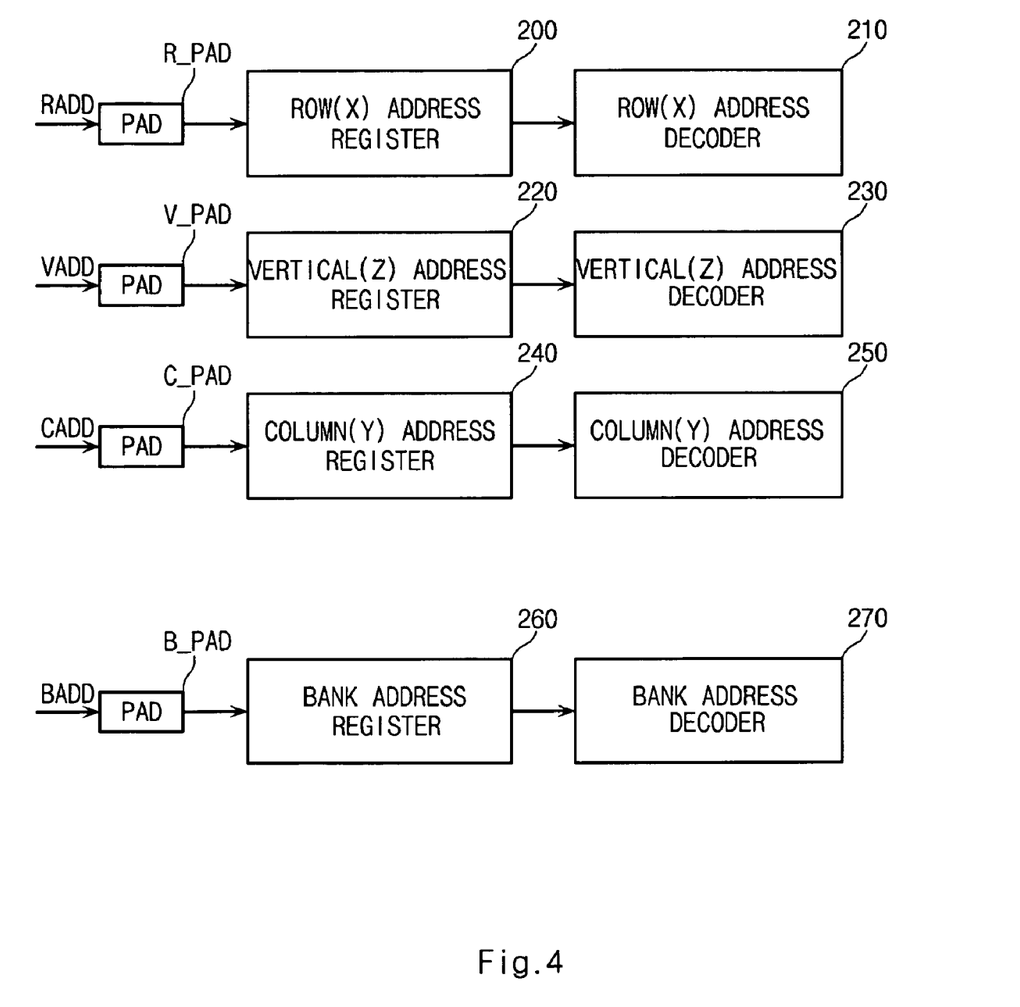
FIG. 4 is a diagram illustrating an address decoding unit of a nonvolatile semiconductor memory device according to an embodiment consistent with the present invention.

FIG. 4 is a diagram illustrating an address decoding unit of a nonvolatile semiconductor memory device according to an embodiment consistent with the present invention.

Address decoding unit may include a row (X) address register 200, a row address decoder 210, a vertical (Z) address register 220, a vertical address decoder 230, a column (Y) address register 240, a column address decoder 250, a bank address register 260, and a bank address decoder 270.

Row address register 200 may store a row address RADD. Row address decoder 210 may decode an output signal from row address register 200. Vertical address register 220 may store a vertical address VADD. Vertical address decoder 230 may decode an output signal from vertical address register 220.

Column address register 240 may store a column address CADD. Column address decoder 250 may decode an output signal from column address register 240. Bank address register 260 may store a bank address BADD. Bank address decoder 270 may decode an output signal from bank address register 260.

Row address register 200, vertical address register 220, and column address register 240 may process row address RADD, vertical address VADD, and column address CADD, which may be inputted from separate pads R_PAD, V_PAD, C_PAD. Bank address register 260 may process bank address BADD inputted from each individual pad B_PAD.

Figure 5:
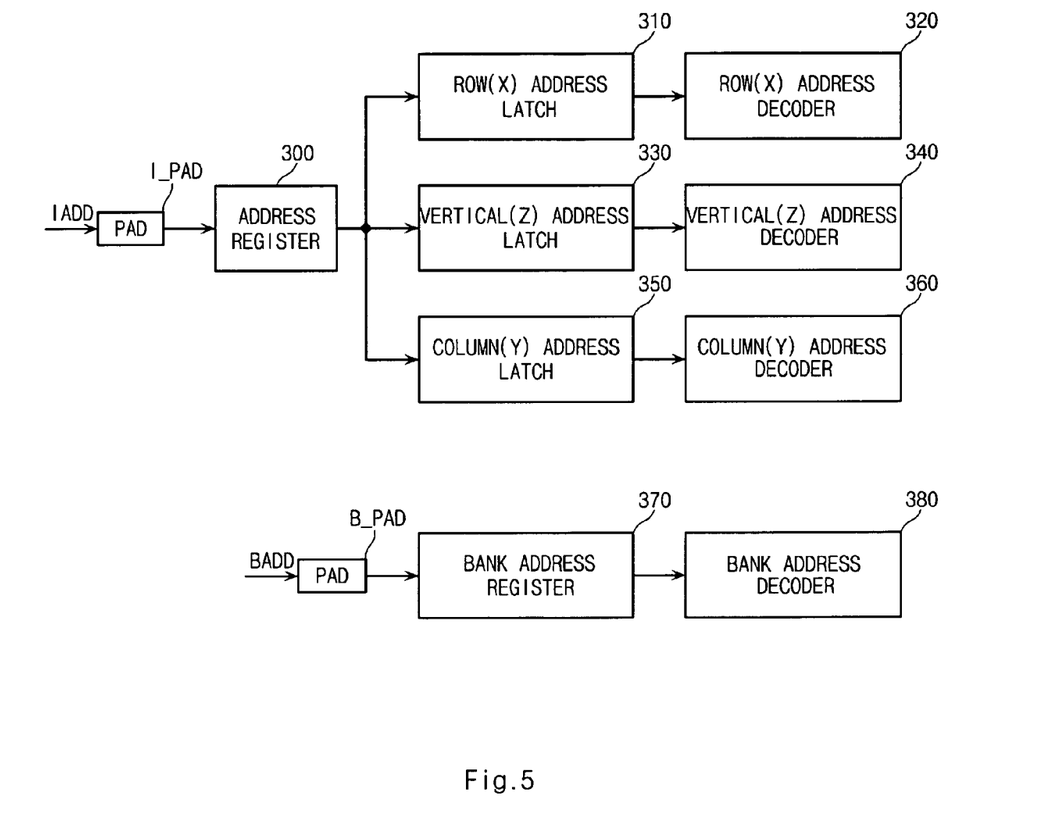
FIG. 5 is a diagram illustrating an address decoding unit of a nonvolatile semiconductor memory device according to an embodiment consistent with the present invention.

FIG. 5 is a diagram illustrating an address decoding unit of a nonvolatile semiconductor memory device according to an embodiment consistent with the present invention.

In one embodiment, address decoding unit may include an address register 300, a row address latch 310, a row address decoder 320, a vertical address latch 330, a vertical address decoder 340, a column address latch 350, a column address decoder 360, a bank address register 370, and a bank address decoder 380.

Address register 300 may store an input address IADD. Row address latch 310 may latch an output signal from address register 300 to a row address. Row address decoder 320 may decode an output signal from row address latch 310. Vertical address latch 330 may latch an output signal from address register 300 to a vertical address. Vertical address decoder 340 may decode an output signal from vertical address latch 330.

Column address latch 350 may latch an output signal from address register 300 to a column address. Column address decoder 360 may decode an output signal from column address latch 350. Bank address register 370 may store a bank address BADD. Bank address decoder 380 may decode an output signal from bank address register 370.

Address register 300 may process input address IADD inputted through one common pad I_PAD. Address register 300 may timeshare input address IADD to output row address RADD, vertical address VADD, and column address CADD by a timeshare multiplexing system.

That is, row address RADD and vertical address VADD are inputted in the first timesharing, and column address CADD is inputted in the second timesharing. Otherwise, row address RADD is inputted in the first timeslot, and vertical address VADD and column address CADD are inputted in the second timeslot. The bank address register 260 may process bank address BADD inputted from each individual pad B_PAD.

Figure 6:
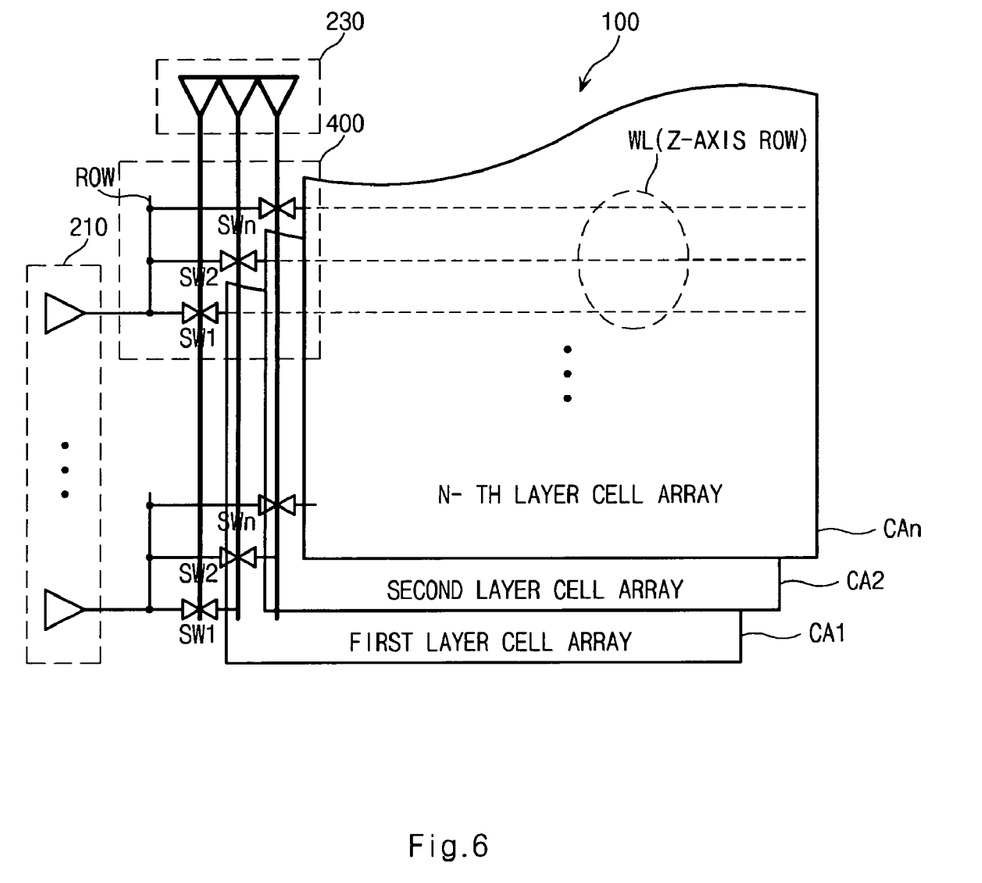
FIGS. 6 through 8 are diagrams illustrating the address decoding unit of FIG. 4.

FIG. 6 is a diagram illustrating address decoding unit of FIG. 4 with respect to the row addresses.

Address decoding unit with respect to the row addresses may include vertical address decoder 230, row address decoder 210, and a row decoding unit 400. Row decoding unit 400 may include a plurality of switches SW1~SWn corresponding respectively to word lines WL in cell arrays CA1~CAn.

Vertical address decoder 230 may be configured to select one of cell arrays CA1~CAn, which are deposited vertically in one unit block cell array 100. Row address decoder 210 may be configured to select one of word lines WL in one of cell arrays CA1~CAn selected by vertical address decoder 230.

Switches SW1~SWn of row decoding unit 400 may be configured to selectively connect a row line ROW selected by an output signal from row address decoder 210 to a word line WL of selected one of cell arrays CA1~CAn depending on output states of vertical address decoder 230.

Figure 7:
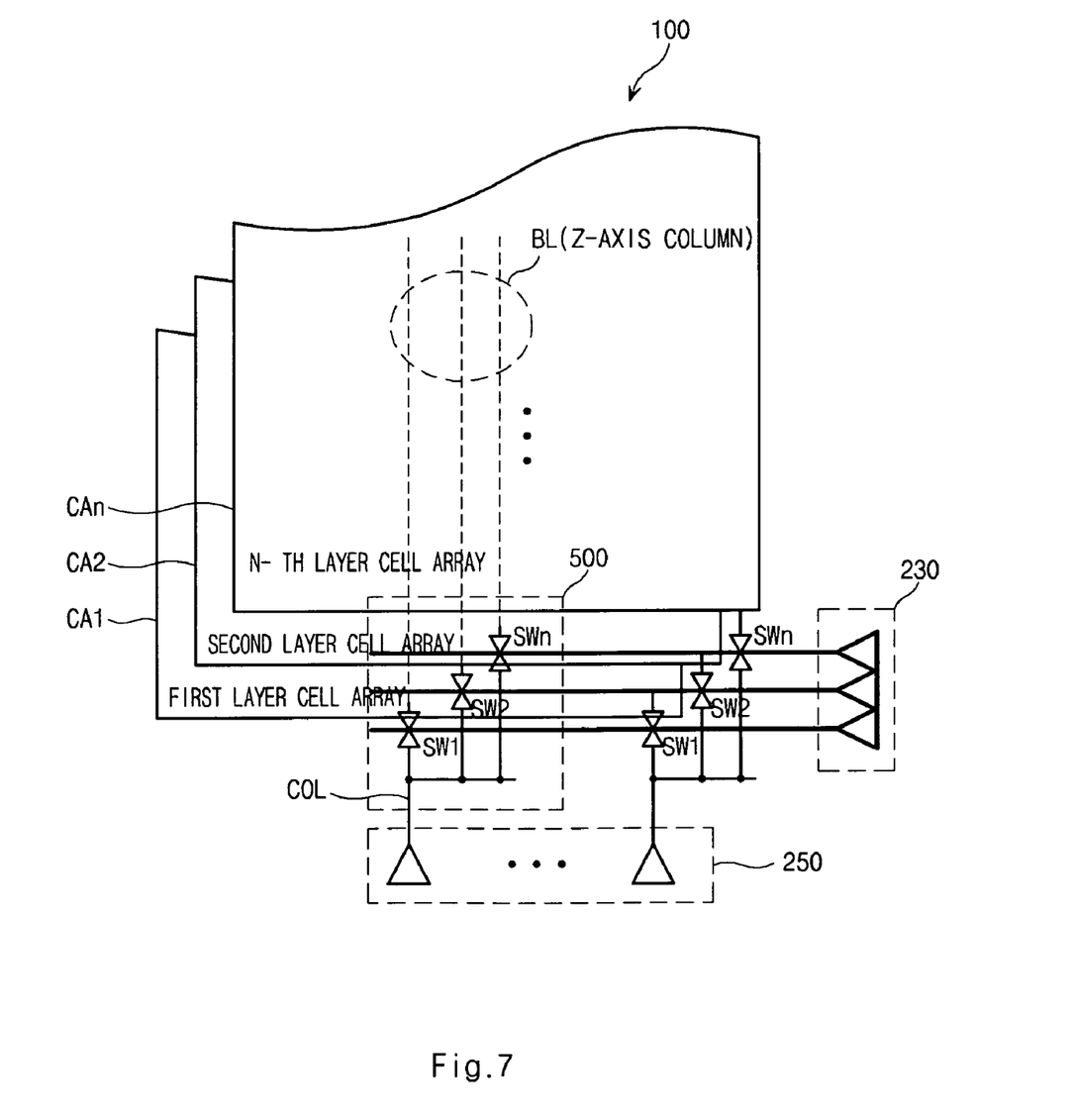

FIG. 7 is a diagram illustrating address decoding unit of FIG. 4 with respect to the column addresses.

Address decoding unit with respect to the column addresses may include vertical address decoder 230, column address decoder 250, and a column decoding unit 500. Column decoding unit 500 may include a plurality of switches SW1~SWn corresponding respectively to bit lines BL in cell arrays CA1~CAn.

Vertical address decoder 230 may be configured to select one of cell arrays CA1~CAn, which are deposited vertically in unit block cell array 100. Column address decoder 250 may be configured to select one of bit lines BL in one of cell arrays CA1~CAn selected by vertical address decoder 230.

Switches SW1~SWn of column decoding unit 500 may be configured to selectively connect a column line COL selected by an output signal from column address decoder 250 to bit line BL of selected one of cell arrays CA1~CAn, depending on output of vertical address decoder 230.

Figure 8:
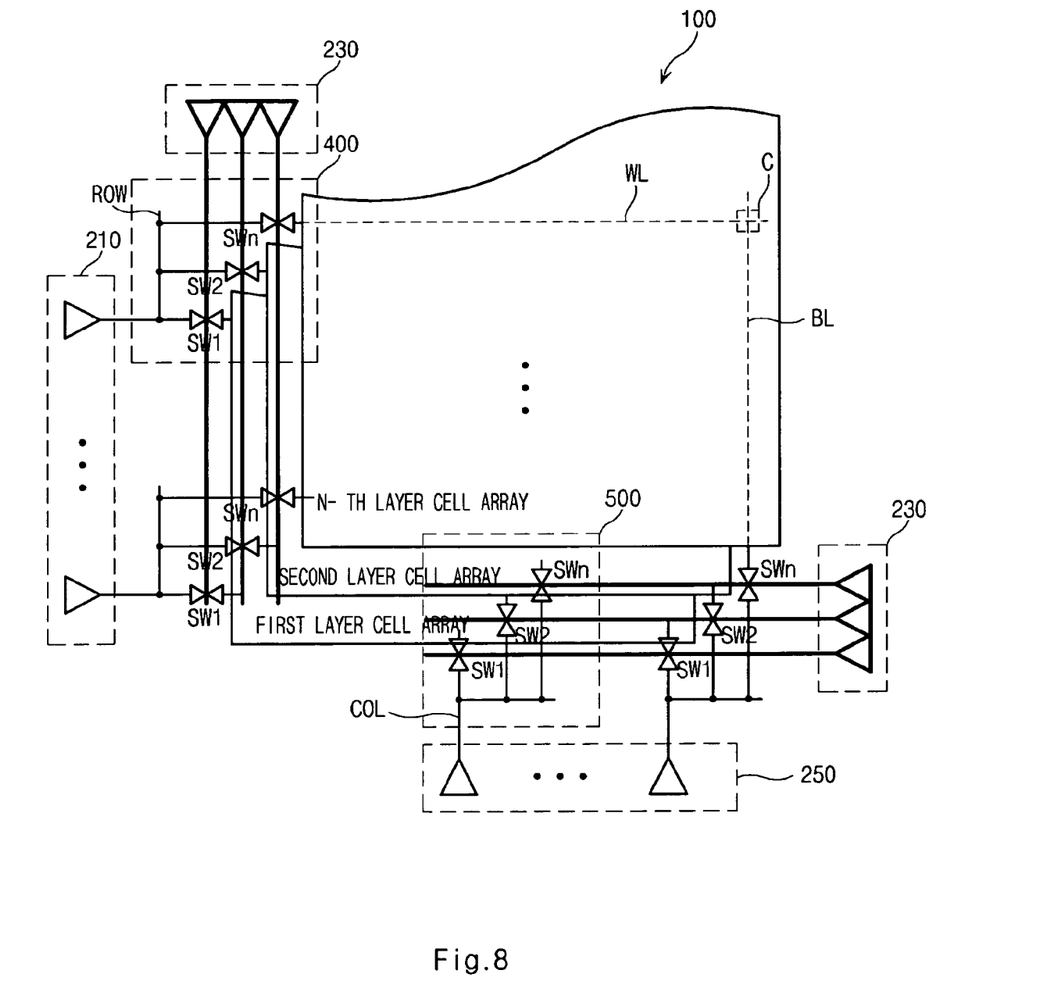

As shown in FIG. 8, read/write operations may be performed on unit cell C in a region where the word line WL selected by row decoding unit 400 crosses bit line BL selected by column decoding unit 500.

Figure 9:
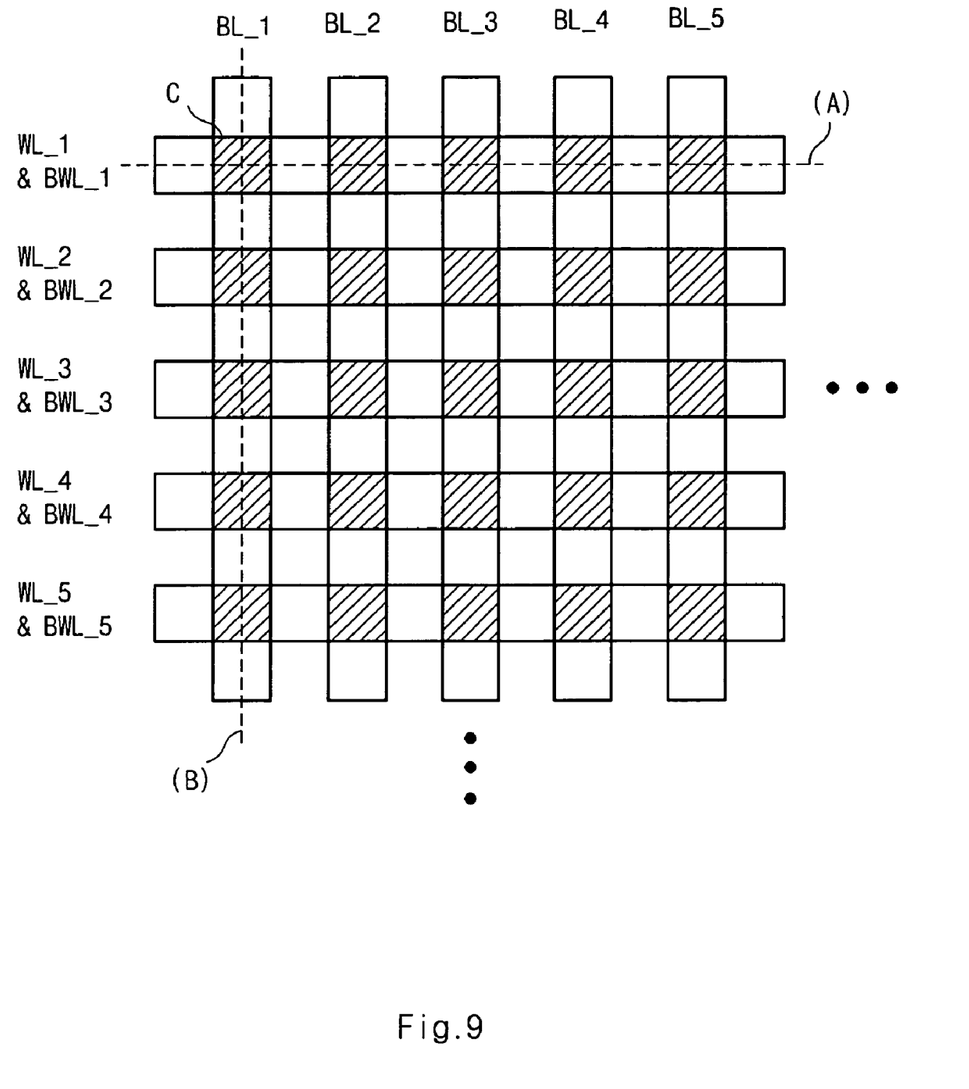
FIG. 9 is a cross-sectional diagram illustrating a cell array of FIG. 1.

FIG. 9 is a layout cross-sectional diagram illustrating the n-th layer cell array CAn of FIG. 1.

A plurality of word lines WL may be arranged in parallel with a plurality of bottom word lines BWL in a column direction. A plurality of bit lines BL may be arranged perpendicular to word lines WL. A plurality of unit cells C may be located in a region where word lines WL, bottom word lines BWL, and bit lines BL are crossed.

Figure 10:
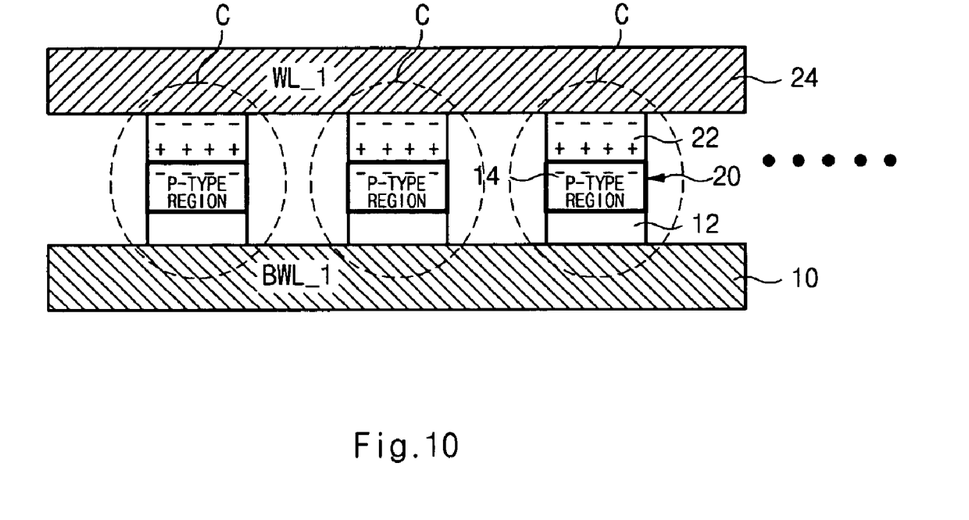
FIGS. 10 and 11 are cross-sectional diagrams illustrating the cell array of FIG. 9.

FIG. 10 is a cross-sectional diagram illustrating the nth layer cell array CAn of FIG. 9 in a direction (A) parallel to word line WL.

The nth layer cell array CAn may include a plurality of insulating layers 12 over bottom word lines 10, and a plurality of P-type channel regions 14 over insulating layers 12. A plurality of ferroelectric layers 22 may be formed over P-type channel regions 14. A plurality of word lines 24 may be formed in parallel with bottom word lines 10 over ferroelectric layers 22. As a result, a plurality of cells C are connected between one word line WL_1 and one bottom word line BWL_1.

Figure 11:
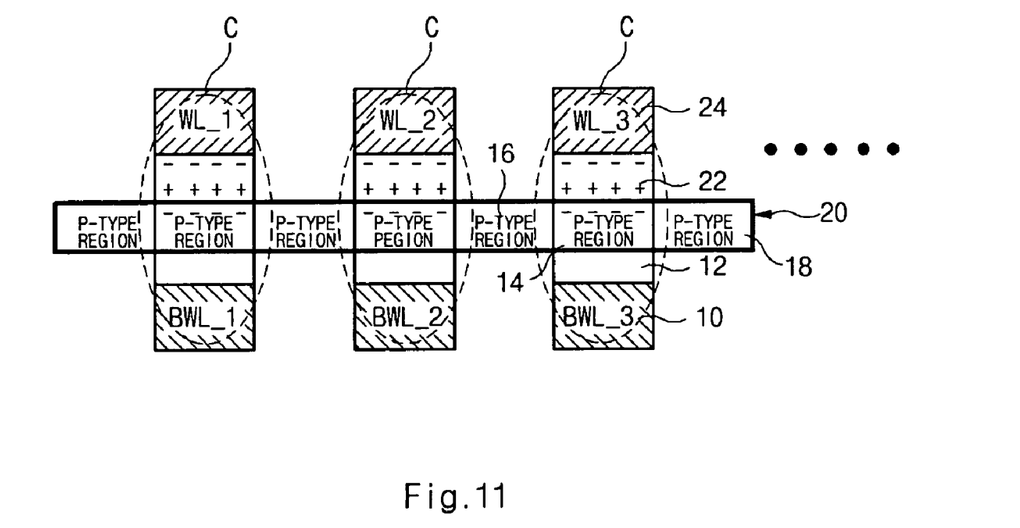

FIG. 11 is a cross-sectional diagram illustrating the n-th layer cell array CAn in a direction (B) perpendicular to word line WL.

In the n-th layer cell array CAn, insulating layers 12 may be formed over bottom word lines BWL_1, BWL_2, and BWL_3. A floating channel layer 20 including a P-type drain region 16, a P-type channel region 14, and a P-type source region 18 is formed over insulating layer 12. P-type drain region 16, P-type channel region 14, and P-type source region 18 may be connected in series. More specifically, P-type source region 18 and P-type drain region 16 are connected on both sides of P-type channel region 14.

P-type drain region 16 may be used as a source region for an adjacent cell, and P-type source region 18 may be used as a drain region for an adjacent cell. That is, P-type region 16 may be used as a common drain region and as a common source region for the two cells adjacent to P-type region 16.

Drain region 16, source region 12, and channel region 14 of floating channel layer 20 may be formed as P-type. A semiconductor of floating channel layer 20 is selected from the group consisting of a carbon nano tube, a silicon, a germanium, and an organic semiconductor.

Ferroelectric layer 22 may be formed over channel region 14 of floating channel layer 20, and word lines WL_1, WL_2, and WL_3 are formed over ferroelectric layer 22. Bottom word line 10 and word line 24 are selectively driven by the same row address decoder (not shown).

Data may be read/written using a channel resistance of floating channel layer 20, which is differentiated depending on a polarization state of ferroelectric layer 22. That is, when the polarity of ferroelectric layer 22 induces positive (+) charges to channel region 14, memory cell C becomes at a high resistance state so that a channel is turned "off." When the polarity of ferroelectric layer 22 induces negative (−) charges to channel region 14, memory cell C becomes at a low resistance state so that a channel is turned "on."

Figure 12:
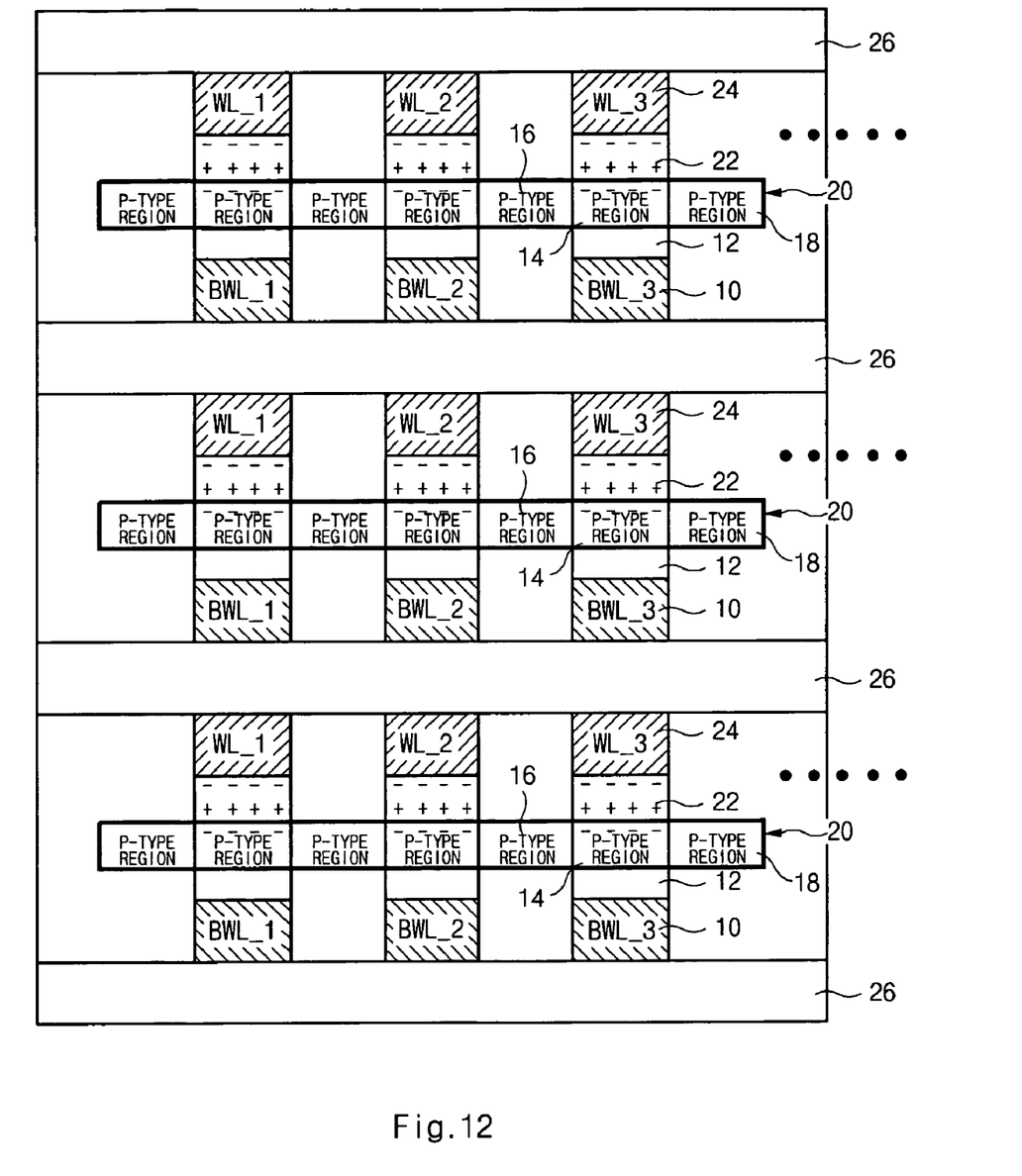
FIG. 12 is a cross-sectional diagram illustrating the unit block cell array of FIG. 1.

FIG. 12 is a cross-sectional diagram illustrating unit block cell array 100 of FIG. 1.

Unit block cell array 100 may include a plurality of multi-layered unit cell arrays CA1~CAn, as shown in FIG. 11, which are separated by cell insulating layers 26.

Figure 13:
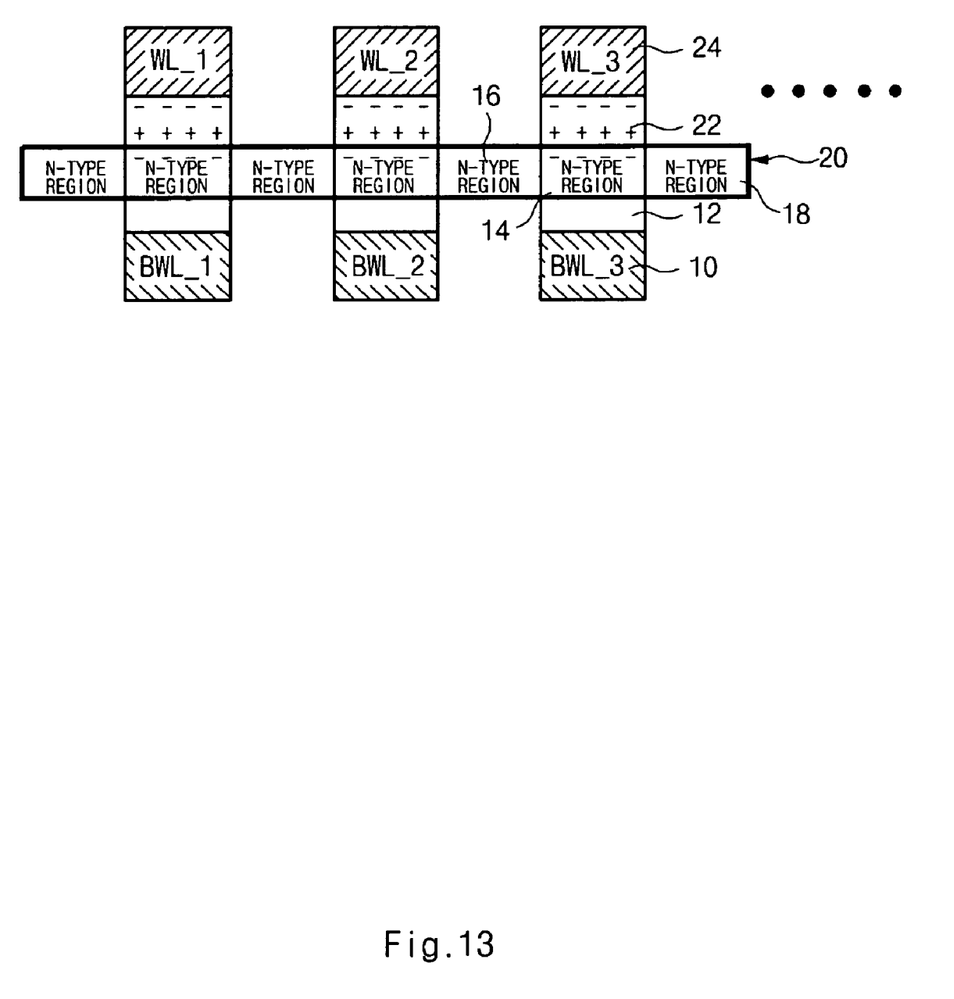
FIG. 13 is a diagram illustrating the cell array of FIG. 9.

Although floating channel layer 20 may include P-type drain region 16, P-type channel region 14, and P-type source region 18 in one embodiment consistent with the present invention, floating channel layer 20 may include an N-type drain region 16, an N-type channel region 14, and an N-type source region 12, as shown in FIG. 13.

In one embodiment, the read/write operations of high data of the nonvolatile semiconductor memory device are explained as follows.

When writing data "1," a ground voltage <GND> may be applied to bottom word line 10, and a negative voltage <−V> may be applied to word line 24. Drain region 16 and source region 18 may be configured to be at a ground voltage <GND> state.

A voltage may be applied between ferroelectric layer 22 and P-type channel region 14 of floating channel layer 20 by voltage distribution of a capacitor between ferroelectric layer 22 and insulating layer 12. As a result, positive charges may be induced in channel region 14 depending on the polarity of ferroelectric layer 22, so that memory cell C may have a low resistance state. Thus, data "1" is written in all memory cells C in a write mode.

When reading data "1," ground voltage <GND> or a read voltage <+Vrd> having a positive value may be applied to bottom word line 10. Ground voltage <GND> may be applied to word line 17. A depletion layer may be formed in the bottom of channel region 14 by read voltage <+Vrd> applied from bottom word line 10.

A depletion layer may not be formed at the top of channel region 14, because positive charges may be induced at the top of channel region 14. Thus, channel region 14 is turned on to conduct current from source region 18 to drain region 16. As a result, the data "1" stored in memory cell C may be read in a read mode. Even when a slight voltage difference is generated in drain region 16 and source region 18, channel region 14 is turned on, so that a large amount of current flows.

In one embodiment, the read/write operations of low data of the nonvolatile semiconductor memory device are explained as follows.

When writing data "0," a negative voltage <−V> may be applied to bottom word line 10, and a ground voltage <GND> may be applied to word line 24. Negative voltage <−V> may be applied to drain region 16 and source region 18.

A high voltage difference is formed between a positive voltage <+V> applied from word line 24 and negative voltage <−V> of channel region 14. As a result, negative charges are induced in channel region 14 depending on the polarity of ferroelectric layer 22, so that memory cell C may have a high resistance state.

When reading data "0," ground voltage <GND> or a read voltage <+Vrd> having a positive value may be applied to bottom word line 10. Ground voltage <GND> may be applied to word line 24.

A depletion layer is formed in the bottom of channel region 14 by read voltage <+Vrd> applied from bottom word line 10.

Negative charges are induced at the top of channel region 14, so that a depletion layer is formed at the top of channel region 14. A channel of channel region 14 is turned off by the depletion layers formed in channel region 14, so that a current path is disconnected between source region 18 and drain region 16.

Even when a slight voltage difference is generated between drain region 16 and source region 18, channel region 14 is turned off, so that a small amount of current flows. Thus, the data "0" stored in memory cell C may be read in a read mode.

The data retention characteristics of memory cells C are improved, because word line 24 and bottom word line 10 are grounded in the read mode without applying a voltage stress to ferroelectric layer 22.

As described above, in a nonvolatile ferroelectric memory device according to an embodiment consistent with the present invention, a Non-Destructive Read Out (NDRO) system may prevent cell data from being destroyed in a read mode. The nonvolatile ferroelectric memory device improves the reliability of the memory cells and the read operation speed in a low voltage operation of a nano-scaled ferroelectric cell. A plurality of ferroelectric unit cell arrays are arranged in row and column directions. Also, the ferroelectric unit cell arrays are deposited vertically to improve integration capacity of the memory cells, thereby reducing the whole size of the nonvolatile ferroelectric memory device. The vertically deposited unit block cell arrays are divided in a bank, and configured to perform read/write operations, thereby improving the operation speed of the memory cells. A vertical (Z) address decoder selects one of the unit block cell arrays to drive the cell arrays effectively, thereby improving the operation speed of the cells.

The foregoing embodiments consistent with the present invention has been described for purposes of illustration. It is not intended to be exhaustive, or to limit the invention to the precise form disclosed. It is appreciated that modifications and variations are possible in light of the above teachings, or may be acquired from practice of the invention. Thus, the embodiments were chosen and described in order to explain the principles of the invention and its practical applications to enable one skilled in the art to utilize the invention in various embodiments and with various modifications as are suited to the particular use contemplated. For example, a person of ordinary skill in the art may select one of well-known nonvolatile memory cells, such as a PRAM cell, a MRAM cell, a ReRAM cell, and so forth, instead of the FeRAM cell described in the embodiments.

What is claimed is:

1. A nonvolatile semiconductor memory device, comprising:
    a plurality of unit bank cell arrays, the unit bank cell arrays having a plurality of unit block cell arrays, the unit block cell arrays including a plurality of cell array layers, the cell array layers having a plurality of unit cells arranged in row and column directions,
    wherein the unit block cell arrays are arranged in directions X, Y, and Z based on a deposition direction of their respective cell array layers, and the unit cells are configured to perform read/write operations individually, and
    wherein the unit cells comprise:
        a bottom word line;
        an insulating layer formed over the bottom word line;
        a floating channel layer formed over the insulating layer and kept at a floating state;
        a ferroelectric layer formed over the floating channel layer where data is stored; and
        a word line formed over the ferroelectric layer in parallel with the bottom word line,
    wherein a variable resistance is induced to a channel region of the floating channel layer depending on a polarity state of the ferroelectric layer so that data is read/written.

2. The nonvolatile semiconductor memory device according to claim 1, wherein the unit block cell arrays select one of the cell array layers by a vertical address during a read/write process.

3. The nonvolatile semiconductor memory device according to claim 1, wherein the unit cells include a FeRAM cell, a PRAM cell, a MRAM cell, or a ReRAM cell.

4. The nonvolatile semiconductor memory device according to claim 1, wherein the floating channel layer comprises one of a carbon nano tube, a silicon, a germanium and an organic semiconductor.

5. The nonvolatile semiconductor memory device according to claim 1, wherein the floating channel layer comprises the channel region formed over the insulating layer and kept at a floating state, and a drain region and a source region which are connected to both sides of the channel region.

6. The nonvolatile semiconductor memory device according to claim 5, wherein the channel region, the drain region, and the source region are P-type.

7. The nonvolatile semiconductor memory device according to claim 5, wherein the channel region, the drain region, and the source region are N-type.

8. A nonvolatile semiconductor memory device, comprising:
    a plurality of unit bank cell arrays, the unit bank cell arrays having a plurality of unit block cell arrays, the unit block cell arrays including a plurality of cell array layers, the cell array layers having a plurality of unit cells arranged in row and column directions,
    wherein the unit block cell arrays are arranged in directions X, Y, and Z based on a deposition direction of their respective cell array layers, and the unit cells are configured to perform read/write operations individually, and
    wherein the cell array layers comprise:
        a plurality of bottom word lines;
        an insulating layer formed over the plurality of bottom word lines;
        a floating channel layer formed over the insulating layer and including a plurality of drain and source regions serially connected to the plurality of channel regions alternately;
        a ferroelectric layer formed over the floating channel layer; and
        a plurality of word lines formed over the ferroelectric layer so as to be connected to the plurality of bottom word lines,
    wherein a different resistance is induced to a channel region of the floating channel layer depending on a polarity state of the ferroelectric layer so that data are read/written.

9. The nonvolatile semiconductor memory device according to claim 8, further comprising a cell insulating layer formed between the cell array layers so as to separate the cell array layers from each other.

10. The nonvolatile semiconductor memory device according to claim 8, wherein the channel regions, the drain regions, and the source regions are P-type.

11. The nonvolatile semiconductor memory device according to claim 8, wherein the channel regions, the drain regions, and the source regions are N-type.

12. A nonvolatile semiconductor memory device, comprising:
- a unit bank cell array including at least a unit block cell array, the unit block cell array further including:
  - a first cell array including a plurality of first unit cells, the first unit cells being arranged in row and column directions; and
  - at least one second cell array including a plurality of second unit cells, the second unit cells being arranged in row and column directions, the second cell array being arranged in a vertical direction relative to the first cell array,
- wherein the unit block cell array includes one selected from the first cell array and the second cell arrays according to a vertical address, and
- wherein the unit cells comprise:
  - a bottom word line;
  - an insulating layer formed over the bottom word line;
  - a floating channel layer formed over the insulating layer and kept at a floating state;
  - a ferroelectric layer formed over the floating channel layer where data is stored; and
  - a word line formed over the ferroelectric layer in parallel with the bottom word line,
  - wherein a different resistance is induced to a channel region of the floating channel layer depending on a polarity state of the ferroelectric layer so that data is read/written.

13. The nonvolatile semiconductor memory device according to claim 12, wherein the unit block cell arrays are arranged in directions X, Y, and Z, so as to perform read/write operations individually.

14. The nonvolatile semiconductor memory device according to claim 12, wherein the unit cells include a FeRAM cell, a PRAM cell, a MRAM cell, or a ReRAM cell.

15. The nonvolatile semiconductor memory device according to claim 12, wherein the floating channel layer comprises one of a carbon nano tube, a silicon, a germanium and an organic semiconductor.

16. The nonvolatile semiconductor memory device according to claim 12, wherein the floating channel layer comprises a channel region formed over the insulating layer and kept at a floating state, and a drain region and a source region which are connected to both sides of the channel region.

17. The nonvolatile semiconductor memory device according to claim 16, wherein the channel region, the drain region, and the source region are P-type.

18. The nonvolatile semiconductor memory device according to claim 16, wherein the channel region, the drain region, and the source region are N-type.

19. A nonvolatile semiconductor memory device, comprising:
- a unit bank cell array including at least a unit block cell array, the unit block cell array further including:
  - a first cell array including a plurality of first unit cells, the first unit cells being arranged in row and column directions; and
  - at least one second cell array including a plurality of second unit cells, the second unit cells being arranged in row and column directions, the second cell array being arranged in a vertical direction relative to the first cell array,
- wherein the unit block cell array includes one selected from the first cell array and the second cell arrays according to a vertical address, and
- wherein the first cell array and the second cell array comprise:
  - a plurality of bottom word lines;
  - an insulating layer formed over the plurality of bottom word lines;
  - a floating channel layer formed over the insulating layer and including a plurality of drain and source regions serially connected to the plurality of channel regions alternately;
  - a ferroelectric layer formed over the floating channel layer; and
  - a plurality of word lines formed over the ferroelectric layer so as to be connected to the plurality of bottom word lines,
  - wherein a different resistance is induced to a channel region of the floating channel layer depending on a polarity state of the ferroelectric layer so that data are read/written.

20. The nonvolatile semiconductor memory device according to claim 19, further comprising a cell insulating layer formed between the first cell array and the second cell array so as to separate the first and second cell arrays from each other.

21. The nonvolatile semiconductor memory device according to claim 19, wherein the plurality of channel regions, the plurality of drain regions, and the plurality of source regions are P-type.

22. The nonvolatile semiconductor memory device according to claim 19, wherein the plurality of channel regions, the plurality of drain regions, and the plurality of source regions are N-type.

23. A nonvolatile semiconductor memory device comprising:
- a unit block cell array including a plurality of cell array layers vertically deposited on top of each other, the cell array layers having a plurality of unit cells arranged in row and column directions;
- a row address decoder configured to decode a row address to activate a word line of a selected one of the cell arrays;
- a vertical address decoding unit configured to decode a vertical address to the selected one of the cell arrays, and to connect an output signal of the row address decoder to a word line of the selected cell array;
- a column address decoder configured to decode a column address to activate a bit line of the selected cell array;
- a row address register configured to output the row address to the row address decoder; and
- a column address register configured to output the column address to the column address decoder.

24. The nonvolatile semiconductor memory device according to claim 23, wherein a plurality of unit bank cell arrays comprises a plurality of unit block cell arrays arranged in directions X, Y, and Z, so as to perform read/write operations individually.

25. The nonvolatile semiconductor memory device according to claim 23, wherein the vertical address decoding unit comprises:
- a vertical address decoder configured to decode the vertical address and select one of the plurality of cell arrays; and
- a row decoding unit configured to selectively connect a word line of the selected cell array to a row line which provides an output signal from the row address decoder.

26. The nonvolatile semiconductor memory device according to claim 25, wherein the row decoding unit includes a plurality of switches, connected between the row lines and the word lines, each being configured to be switched in response to an output signal from the vertical address decoder.

27. The nonvolatile semiconductor memory device according to claim 25, wherein the vertical address decoder further comprises a vertical address register configured to output the vertical address to the vertical address decoder.

28. The nonvolatile semiconductor memory device according to claim 23, wherein the row address, the column address, and the vertical address are individually input from pads.

29. The nonvolatile semiconductor memory device according to claim 24, further comprising:
   a bank address register configured to output a bank address; and
   a bank address decoder configured to decode an output signal from the bank address register to select one of the plurality of unit bank cell arrays.

30. The nonvolatile semiconductor memory device according to claim 29, wherein the bank address is input from an individual pad.

31. A nonvolatile semiconductor memory device comprising:
   a unit block cell array including a plurality of cell array layers vertically deposited on top of each other, the cell array layers having a plurality of unit cells arranged in row and column directions;
   a row address decoder configured to decode a row address to activate a word line of a selected one of the cell arrays;
   a vertical address decoding unit configured to decode a vertical address to the selected one of the cell arrays, and to connect an output signal of the row address decoder to a word line of the selected cell array;
   a column address decoder configured to decode a column address to activate a bit line of the selected cell array;
   an address register configured to control input addresses to output the row address, the column address, and the vertical address;
   a row address latch configured to latch the row address;
   a column address latch configured to latch the column address; and
   a vertical address latch configured to latch the vertical address.

32. The nonvolatile semiconductor memory device according to claim 31, wherein the input addresses are input through one common pad.

33. The nonvolatile semiconductor memory device according to claim 31, wherein the address register is configured to selectively output one of the row address, the column address, and the vertical address by a timesharing multiplexing system.

34. The nonvolatile semiconductor memory device according to claim 33, wherein the address register is configured to timeshare both of the row address and the vertical address, and then the column address.

35. The nonvolatile semiconductor memory device according to claim 33, wherein the address register is configured to timeshare the row address, and then both of the vertical address and the column address.

36. A nonvolatile semiconductor memory device, comprising:
   a plurality of unit bank cell arrays, comprising:
      a unit block cell array including a plurality of cell array layers deposited in a vertical direction, each having a plurality of unit cells arranged in row and column directions;
      a column address decoder configured to decode a column address to activate a bit line of a selected one of the cell array layers;
      a vertical address decoding unit configured to decode a vertical address of the selected cell array layer and to connect an output signal of the column address decoder to a bit line of the selected cell array layer; and
      a row address decoder configured to decode a row address to activate a word line of the selected cell array layer;
   a bank address register configured to output a bank address; and
   a bank address decoder configured to decode the bank address to select one of the unit bank cell arrays.

37. The nonvolatile semiconductor memory device according to claim 36, wherein the unit block cell arrays are arranged in directions X, Y, and Z based on the deposition direction of the cell array layers, so as to perform read/write operations individually.

38. The nonvolatile semiconductor memory device according to claim 36, wherein the vertical address decoding unit comprises:
   a vertical address decoder configured to decode the vertical address and select one of the plurality of cell array layers; and
   a column decoding unit configured to selectively connect a bit line of the selected cell array layer to a column line which is an output signal from the column address decoder.

39. The nonvolatile semiconductor memory device according to claim 38, wherein the column decoding unit includes a plurality of switches, connected between the column lines and the bit lines, the plurality of switches being configured to be switched in response to an output signal from the vertical address decoder.

40. The nonvolatile semiconductor memory device according to claim 38, wherein the vertical address decoder further comprises a vertical address register configured to output the vertical address to the vertical address decoder.

41. The nonvolatile semiconductor memory device according to claim 36, further comprising:
   a row address register configured to output the row address to the row address decoder; and
   a column address register configured to output the column address to the column address decoder.

42. The nonvolatile semiconductor memory device according to claim 41, wherein the row address, the column address, and the vertical address are individually input from pads.

43. The nonvolatile semiconductor memory device according to claim 36, wherein the bank address is input from an individual pad.

44. A nonvolatile semiconductor memory device, comprising:
   a unit block cell array including a plurality of cell array layers deposited in a vertical direction, each having a plurality of unit cells arranged in row and column directions;
   a column address decoder configured to decode a column address to activate a bit line of a selected one of the cell array layers;
   a vertical address decoding unit configured to decode a vertical address of the selected cell array layer and to connect an output signal of the column address decoder to a bit line of the selected cell array layer;
   a row address decoder configured to decode a row address to activate a word line of the selected cell array layer;
   an address register configured to control input addresses to output the row address, the column address, and the vertical address;
   a row address latch configured to latch the row address;

a column address latch configured to latch the column address; and a vertical address latch configured to latch the vertical address.

45. The nonvolatile semiconductor memory device according to claim 44, wherein the input addresses are input through one common pad.

46. The nonvolatile semiconductor memory device according to claim 44, wherein the address register is configured to selectively output one of the row address, the column address, and the vertical address by a timesharing multiplexing system.

47. The nonvolatile semiconductor memory device according to claim 46, wherein the address register is configured to timeshare both of the row address and the vertical address, and then the column address.

48. The nonvolatile semiconductor memory device according to claim 46, wherein the address register is configured to timeshare the row address, and then both of the vertical address and the column address.

* * * * *